United States Patent
Karakida et al.

(10) Patent No.: US 8,450,602 B2
(45) Date of Patent: May 28, 2013

(54) SOLAR CELL AND MANUFACTURING METHOD THEREOF

(75) Inventors: Shoichi Karakida, Chiyoda-ku (JP); Takahiko Nishida, Chiyoda-ku (JP); Mitsunori Nakatani, Chiyoda-ku (JP); Hiroaki Morikawa, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/023,910

(22) Filed: Feb. 9, 2011

(65) Prior Publication Data
US 2011/0126901 A1 Jun. 2, 2011

Related U.S. Application Data

(62) Division of application No. 11/597,108, filed as application No. PCT/JP2005/021783 on Nov. 28, 2005, now Pat. No. 7,910,823.

(51) Int. Cl.
*H01L 31/00* (2006.01)
*H02N 6/00* (2006.01)

(52) U.S. Cl.
USPC ............ 136/256; 136/243; 136/252

(58) Field of Classification Search
USPC ................................ 136/243, 256
See application file for complete search history.

(56) References Cited

U.S. PATENT DOCUMENTS

| | | | |
|---|---|---|---|
| 5,279,682 A | 1/1994 | Wald et al. | |
| 2005/0126626 A1 | 6/2005 | Tanaka et al. | |
| 2006/0231803 A1 | 10/2006 | Wang et al. | |

FOREIGN PATENT DOCUMENTS

| | | |
|---|---|---|
| JP | 10-144943 A | 5/1998 |
| JP | 10-335267 A | 12/1998 |
| JP | 2002-217435 A | 8/2002 |
| JP | 2003-273378 A | 9/2003 |
| JP | 2003-273379 A | 9/2003 |
| JP | 2004-179336 A | 6/2004 |
| JP | 2005-183457 A | 7/2005 |
| WO | WO 92/05587 | 4/1992 |
| WO | WO 92/22928 | 12/1992 |
| WO | WO 92/22929 | 12/1992 |
| WO | WO 93/24961 A1 | 12/1993 |

OTHER PUBLICATIONS

International Search Report (PCT/ISA/210) issued on Feb. 28, 2006, by Japanese Patent Office as the International Searching Authority for International Application No. PCT/JP2005/021783.

*Primary Examiner* — Jennifer Michener
*Assistant Examiner* — Marla D McConnell
(74) *Attorney, Agent, or Firm* — Buchanan Ingersoll & Rooney PC

(57) ABSTRACT

A solar cell comprises a substrate that includes a photoelectric conversion function, a first electrode provided on one surface of the substrate, a second electrode provided on other surface of the substrate, and a third electrode provided on the other surface of the substrate with its periphery overlapping the second electrode in the in-plane direction of the substrate for extracting an electric power from the second electrode. The thickness of the second electrode is larger than that of the third electrode, and the difference between the thickness of the second electrode and that of the third electrode is within a range from equal to or more than 10 micrometers to equal to or less than 30 micrometers. Thereby, in the solar cell, an electrode separation (alloy separation) can be effectively prevented.

3 Claims, 9 Drawing Sheets

SOLAR CELL AND MANUFACTURING METHOD THEREOF

This application is a divisional of application Ser. No. 11/597,108, filed Nov. 20, 2006, the contents of which are incorporated herein by reference, which is a National Stage filing under §371 of PCT/JP2005/21783, filed Nov. 28, 2005.

TECHNICAL FIELD

The present invention relates to a solar cell and manufacturing method thereof, and more specifically relates to a solar cell and manufacturing method thereof in which separation of electrodes is prevented.

BACKGROUND ART

Photovoltaic power generation is a clean method of generating electric power using inexhaustible light energy without discharging toxic substances. A solar cell is used for the photovoltaic power generation, which is a photoelectric converter that generates electric power by converting light energy from the sun into electric energy.

Conventionally, an electrode on the back of a light receiving surface of a generally produced solar cell is formed by screen-printing silver paste and aluminum paste on the back surface of a silicon substrate, then drying and firing the pastes. The aluminum formed substantially all over the back surface of the silicon substrate serves as a positive electrode. However, in the process of producing a solar cell module, a lead tab for extracting electric power cannot be soldered directly to the aluminum electrode formed of aluminum. Therefore, a silver electrode is formed, as an electrode for extracting electric power, in such a manner as to partially overlap the aluminum electrode on the back surface of the silicon substrate (see Patent Documents 1 and 2).

Patent Document 1: Japanese Patent Publication No. 2003-273378
Patent Document 2: Japanese Patent Publication No. HEI10-335267

DISCLOSURE OF INVENTION

Problem to be Solved by the Invention

As just described, on the back surface of the substrate of the solar cell, an aluminum electrode for higher electric power output and a silver electrode for extracting the electric power are partially overlapped. In the area where the aluminum electrode and the silver electrode are overlapped, three metals of silicon in the silicon substrate, aluminum in the aluminum electrode, and silver in the silver electrode are partially alloyed.

However, the overlapped area (alloyed area) is very fragile due to stress assumedly caused by different rate of thermal expansion of each material that occurs during rapid heating and cooling in firing. Therefore, after the firing for forming an electrode, when, for example, the silver electrode overlaps on the aluminum electrode, the aluminum electrode with the silver electrode can be peeled off in the overlap area. Accordingly, the wire cannot be properly soldered in a next module manufacturing process.

The present invention was made in view of the problems described above, and it is an object of the present invention to provide a solar cell and a manufacturing method thereof in which the separation of electrodes is effectively prevented.

Means for Solving Problem

To solve the problems described above and achieve the object, the solar cell according to the present invention includes a photoelectric conversion layer, a first electrode provided on one surface of the photoelectric conversion layer, a second electrode provided on the other surface of the photoelectric conversion layer, a third electrode provided on the other surface of the photoelectric conversion layer with its periphery overlapping the second electrode in the in-plane direction of the photoelectric conversion layer for extracting electric power from the second electrode. The thickness of the second electrode is larger than that of the third electrode, and a difference in thickness between the second electrode and the third electrode is within a range from equal to or more than 10 micrometers to equal to or more than 30 micrometers.

Effect of the Invention

The solar cell according to the present invention includes a photoelectric conversion substrate, a first electrode provided on a surface of the photoelectric conversion substrate, a second electrode provided on the other surface of the photoelectric conversion substrate, a third electrode provided on the other surface of the photoelectric conversion substrate with its periphery overlapping the second electrode in the in-plane direction of the photoelectric conversion substrate for extracting an electric power from the second electrode. The thickness of the second electrode is larger than that of the third electrode, and a difference in thickness between the second electrode and the third electrode is within a range from equal to or more than 10 micrometers to equal to or more than 30 micrometers. Thereby, bonding strength is increased at an interface between the photoelectric conversion substrate and the second electrode partially alloyed with the third electrode, and better bonding can be realized. As a result, the electrode separation (alloy separation) can be effectively prevented. Further, it becomes possible to effectively prevent faulty electrode fabrication caused by the difference in thickness between the second electrode and the third electrode.

Therefore, according to the present invention, it becomes possible to realize a solar cell in which, while faulty electrode fabrication is prevented, the photoelectric conversion substrate and the second electrode partially alloyed with the third electrode are firmly bonded together, which effectively prevents the electrode separation (alloy separation).

Furthermore, in a module manufacturing process after producing the solar cell, a lead tab can be properly welded to an electrode, which reduces faulty tab welding and improves production yield.

BRIEF DESCRIPTION OF DRAWINGS

FIG. 1-2 is a plan view for explaining a general configuration of a front surface (a light receiving surface) of the solar cell according to the first embodiment of the present invention.

FIG. 1-3 is a plan view for explaining a general configuration of a back surface (a surface opposite to the light receiving surface) of the solar cell according to the first embodiment of the present invention.

FIG. 1-4 is an enlarged schematic of an alloyed area where three metals of silicon, aluminum, and silver are partially alloyed on the solar cell according to the first embodiment of the present invention.

FIG. 2 is an enlarged cross section of a surrounding area of an area B' and an area C', where the aluminum electrode and the back-surface silver electrode are partially overlapped on the back surface of a conventional solar batter cell.

FIG. 3 is a plot for explaining correlation of a difference in thickness between an aluminum electrode and a back-surface silver electrode after firing (a value obtained by subtracting thickness of the back-surface silver electrode from thickness of the aluminum electrode) and occurrence frequency of an electrode (alloy) separation.

FIG. 4 is a plot for explaining correlation of a difference in thickness between an aluminum electrode and a back-surface silver electrode after firing (a value obtained by subtracting thickness of the back-surface silver electrode from thickness of the aluminum electrode) and frequency of printing failure.

FIG. 5-1 is a cross section for explaining a method for manufacturing the solar cell according to the first embodiment of the present invention.

FIG. 5-2 is a cross section for explaining the method for manufacturing the solar cell according to the first embodiment of the present invention.

FIG. 5-3 is a cross section for explaining the method for manufacturing the solar cell according to the first embodiment of the present invention.

FIG. 5-4 is a cross section for explaining the method for manufacturing the solar cell according to the first embodiment of the present invention.

FIG. 5-5 is a cross section for explaining the method for manufacturing the solar cell according to the first embodiment of the present invention.

FIG. 5-6 is a cross section for explaining the method for manufacturing the solar cell according to the first embodiment of the present invention.

FIG. 5-7 is a plan view for explaining an example of a screen mask used for printing with a silver paste in manufacturing the solar cell according to the first embodiment of the present invention.

FIG. 5-8 is a cross section for explaining an example of a screen mask used for printing with a silver paste in manufacturing the solar cell according to the first embodiment of the present invention.

FIG. 5-9 is a cross section for explaining the method for manufacturing the solar cell according to the first embodiment of the present invention.

FIG. 5-10 is a cross section for explaining the method for manufacturing the solar cell according to the first embodiment of the present invention.

FIG. 6 is a cross section for explaining a general configuration of a solar cell according to a second embodiment of the present invention.

FIG. 7 is a cross section for explaining a general configuration of another solar cell according to the second embodiment of the present invention.

EXPLANATIONS OF LETTERS OR NUMERALS

Figure 1:
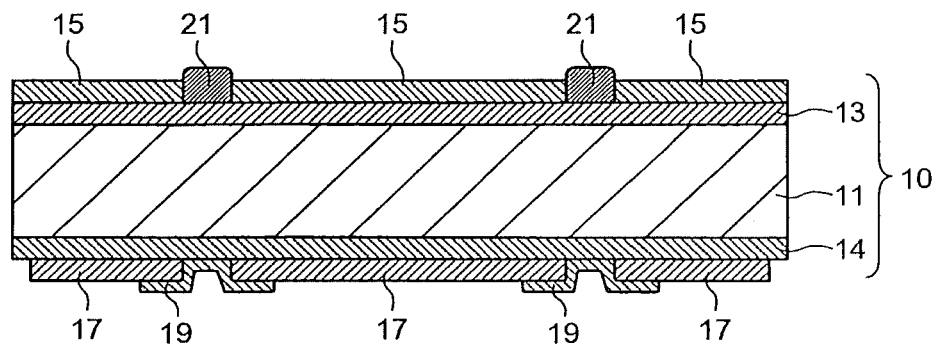
FIG. 1-1 is a cross section for explaining a general configuration of a solar cell according to a first embodiment of the present invention.

10 Semiconductor layer
11 Silicon substrate
13 n-type diffusion layer
13a n-type diffusion layer
14 p+ layer
15 Antireflective coating
17 Aluminum electrode
17a Aluminum paste layer
19 Back-surface silver electrode
19a Silver paste layer
21 Front-surface silver electrode
21a Silver paste layer
23 Alloyed area
25 Mesh
27 Emulsion
29 Mask frame
31 Overlapped area of aluminum electrode and back-surface silver electrode
33 Overlapped area of aluminum electrode and back-surface silver electrode with neighboring area

BEST MODE(S) FOR CARRYING OUT THE INVENTION

Exemplary embodiments of a solar cell according to the present invention are explained below in detail while referring to the accompanying drawings. It should be noted that the present invention is not limited by the following description, but can be changed in various manners within the scope of the present invention. In the accompanying drawings, scale sizes may vary among the drawings and among members depicted therein for better understanding.

First Embodiment

Figures 1, 2:
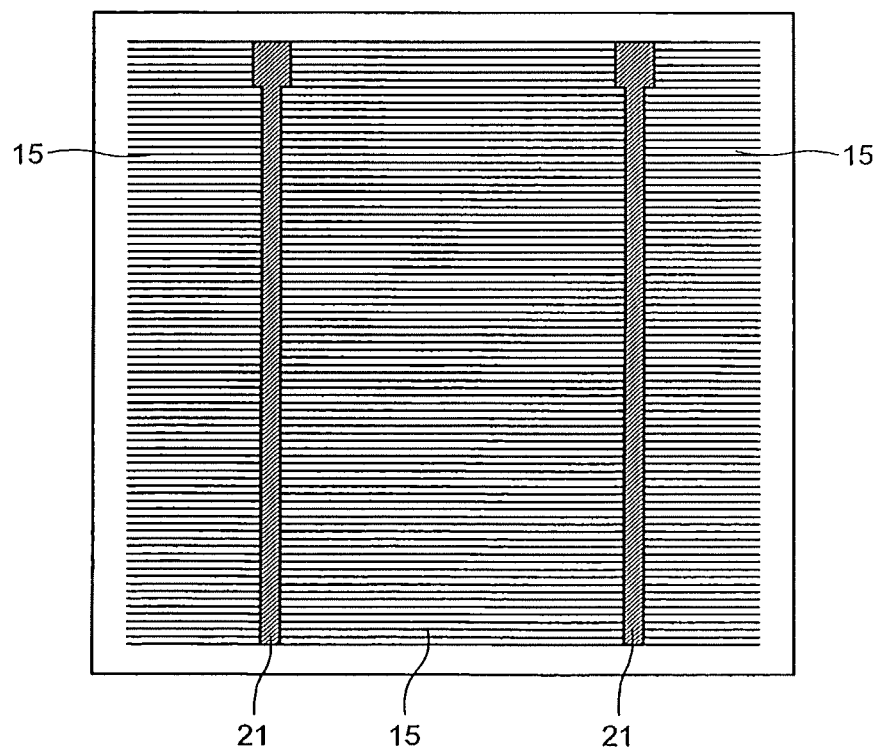
Figures 1, 2, 3:
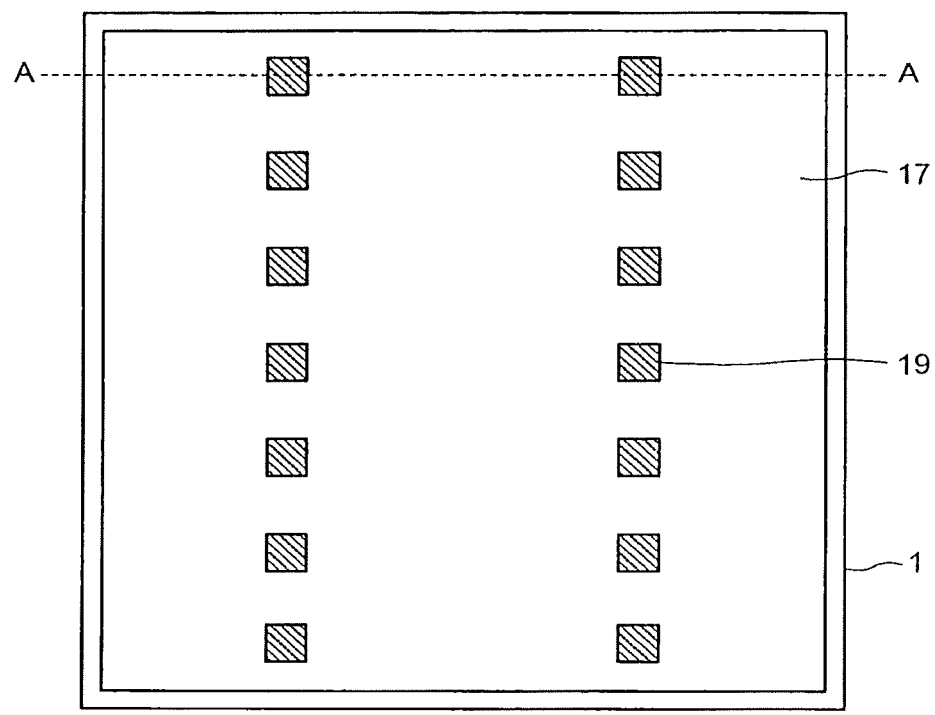

FIGS. 1-1 to 1-3 are drawings for explaining a solar cell according to a first embodiment of the present invention, and FIG. 1-1 is a cross section for explaining a general configuration of the solar cell according to the first embodiment. FIG. 1-2 is a plan view for explaining a general configuration of a front surface (a light receiving surface) of the solar cell according to the first embodiment, and FIG. 1-3 is a plan view for explaining a general configuration of a back surface (a surface opposite to the light receiving surface) of the solar cell according to the first embodiment. Incidentally, FIG. 1-1 is a cross section taken along the line A-A of FIG. 1-3.

The solar cell according to the embodiment includes, as shown in FIGS. 1-1 to 1-3, a semiconductor layer 10 that is a photoelectric conversion layer including a p-type layer 11 that is a p-type silicon substrate as a semiconductor substrate, an n-type diffusion layer 13 with a conductivity type inverse to that of the surface of the p-type layer 11, and a p+ layer (back surface field (BSF) layer) 14 containing a high concentration of impurity; an antireflective coating 15 provided on a light receiving surface of the semiconductor layer 10 to prevent the reflection of incident light; a front-surface silver electrode 21 that is a light receiving surface electrode provided on the light receiving surface of the semiconductor layer 10 substantially in the shape of a stick; an aluminum electrode 17 that is a back-surface electrode provided substantially all over the back surface of the semiconductor layer 10 to extract electric power and reflect the incident light; and a back-surface silver electrode 19 that is an electrode to extract the electric power from the aluminum electrode 17.

In the solar cell according to the embodiment configured as above, when sunlight irradiates the side of the light receiving surface (the side of the antireflective coating 15) of the solar cell and reaches a p-n junction surface (a junction surface of the p-type layer 11 and the n-type diffusion layer 13) inside, a hole and electron pair on the p-n junction surface is separated. The separated electron moves toward the n-type diffusion layer 13. On the other hand, the separated hole moves toward the p+ layer 14. This produces an electrical potential difference between the n-type diffusion layer 13 and the p+ layer 14 so that the p+ layer 14 has a higher potential. This makes the front-surface silver electrode 21 connected to the n-type diffusion layer 13 a negative electrode and the aluminum electrode 17 connected to the p+ layer 14 a positive electrode so that the electricity flows through an external circuit (not shown).

Next, features of the solar cell according to the embodiment are explained. As shown in FIG. 1-4, in the solar cell according to the embodiment, the aluminum electrode 17 and the back-surface silver electrode 19 are partially overlapped on the p+ layer 14. FIG. 1-4 is a schematic that depicts an enlargement of an area surrounding the back-surface silver electrode 19 shown in FIG. 1-1, i.e., a cross section of the surrounding area of an area B and an area C, where the aluminum electrode 17 and the back-surface silver electrode 19 are partially overlapped on the back surface of the solar cell.

In the area B and the area C where the aluminum electrode 17 and the back-surface silver electrode 19 are partially overlapped, three metals of silicon in the p+ layer 14 of the silicon substrate, aluminum in the aluminum electrode 17, and silver in the back-surface silver electrode 19 are partially alloyed to form an alloyed area 23 as shown in FIG. 1-4. While borders of the metals (the silicon, the aluminum, and the silver) in the area B and the area C are clearly defined in FIGS. 1-1 and 1-5, it is needless to say that the areas are partially alloyed and the borders are actually not clear.

The solar cell according to the embodiment is configured, as shown in FIG. 1-4, such that the periphery of the back-surface silver electrode 19 overlaps the aluminum electrode 17 in the in-plane direction of the semiconductor layer 10. The thickness $t_{Al}$ of the aluminum electrode 17 is larger than the thickness $t_{Ag}$ of the back-surface silver electrode 19, and the difference in thickness between the aluminum electrode 17 and the backside silver electrode is equal to or more than 10 micrometers and equal to or less than 30 micrometers.

With the above configuration, in the solar cell according to the embodiment, the alloyed area 23 is assuredly formed in the area B and the area C in which the back-surface silver electrode 19 and the aluminum electrode 17 are partially overlapped each other, the aluminum electrode 17 and the back-surface silver electrode 19 in the alloyed area 23 are firmly bonded together, and the aluminum electrode 17 and the back-surface silver electrode 19 are firmly bonded to the p+ layer 14 of the silicon substrate as shown in FIG. 1-4.

The conventional solar cell is configured, as shown in FIG. 2, such that the periphery of the back-surface silver electrode 19 overlaps the aluminum electrode 17 in the in-plane direction of the semiconductor layer 10. The thickness of the aluminum electrode 17 is larger than that of the back-surface silver electrode 19. That is, the conventional solar cell, similar to the solar cell according to the embodiment, includes an area B' and an area C' in which the back-surface silver electrode 19 and the aluminum electrode 17 are partially overlapped each other. In the area B' and the area C' in which the back-surface silver electrode 19 and the aluminum electrode 17 are partially overlapped each other, three metals of silicon in the p+ layer 14 of the silicon substrate, aluminum in the aluminum electrode 17, and sliver in the back-surface silver electrode 19 are partially alloyed.

In the area B' shown in FIG. 2, the three metals of the silicon in the p+ layer 14 of the silicon substrate, the aluminum in the aluminum electrode 17, and the sliver in the back-surface silver electrode 19 are partially alloyed, and the partially alloyed aluminum electrode 17 and the back-surface silver electrode 19 are not separated (alloy separation). On the other hand, in the area C', the three metals of the silicon in the p+ layer 14 of the silicon substrate, the aluminum in the aluminum electrode 17, and the sliver in the back-surface silver electrode 19 are partially alloyed, and the partially alloyed aluminum electrode 17 and the back-surface silver electrode 19 are separated (alloy separation). In FIG. 2, because of convenience in the drawing, borders of each metal (silicon, aluminum, and silver) are clearly defined; however, it is needless to say that the areas are partially alloyed and the borders are actually not clear.

In the conventional solar cell, however, the partially overlapped area (partially alloyed area) is very fragile and its bonding capability is reduced due to stress assumedly caused by a different rate of thermal-expansion of each metal rapidly heated and cooled during firing in manufacturing. Therefore, after the firing for forming an electrode, the aluminum electrode 17 with the back-surface silver electrode 19 can be separated in the overlapped area as shown in the area C' in FIG. 2. In this case, there occurs a problem that a lead tab cannot be properly welded to the electrode in a next module manufacturing process.

According to a research by the inventors, in the observation of a solar cell after the firing of an electrode in fabrication of the cell, it has been found that an electrode separation (alloy separation), or a separation of the aluminum electrode 17 and the back-surface silver electrode 19 from the silicon substrate (p+ layer 14), sometimes occurs in the overlapped area of the aluminum electrode 17 and the back-surface silver electrode 19 (see area C' in FIG. 2). Besides, it has been found that the separation of the aluminum electrode 17 and the back-surface silver electrode 19 from the silicon substrate (p+ layer 14) is one factor for defective welding of the lead tab to the electrode in the module manufacturing process. It has also been found by the observation that the electrode separation (alloy separation) occurs at the interface between the silicon substrate and the electrodes (where aluminum and silver are partially alloyed) beneath the periphery of the overlapped area of the aluminum electrode 17 and the back-surface silver electrode 19 as shown in the area C' in FIG. 2.

Then, as a result of further research by the inventors, in the solar cell configured that the periphery of the back-surface silver electrode 19 overlaps the aluminum electrode 17 in the in-plane direction of the semiconductor layer 10, when the thickness $t_{Al}$ of the aluminum electrode 17 is larger than the thickness $t_{Ag}$ of the back-surface silver electrode 19 and a difference between the thickness $t_{Al}$ of the aluminum electrode 17 and the thickness $t_{Ag}$ of the back-surface silver electrode 19 is in a range from not less than 10 micrometers to not more than 30 micrometers, it becomes possible to achieve a solar cell in which the silicon substrate (p+ layer 14) is firmly bonded to the aluminum electrode 17 (partially alloyed with the back-surface silver electrode 19) and the electrode separation (alloy separation) is prevented from occurring.

Figures 1, 2, 3, 4:
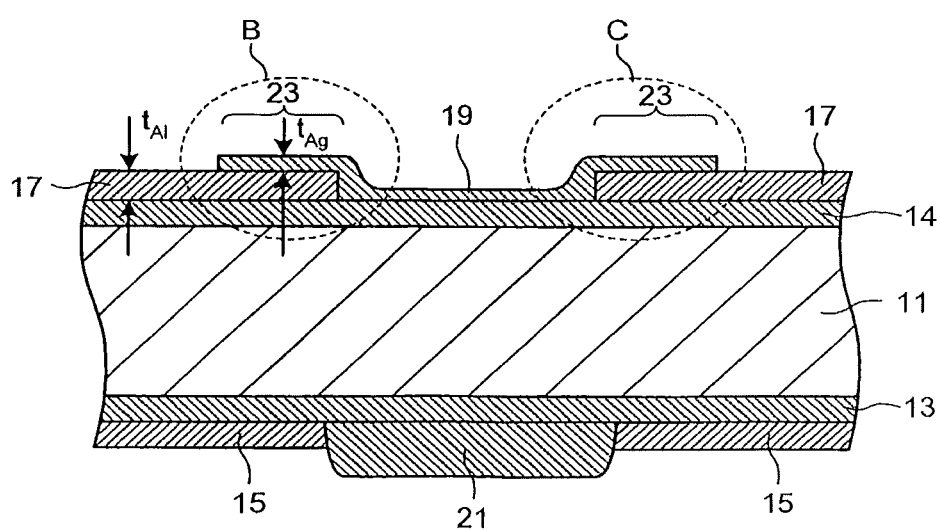
Figure 2:
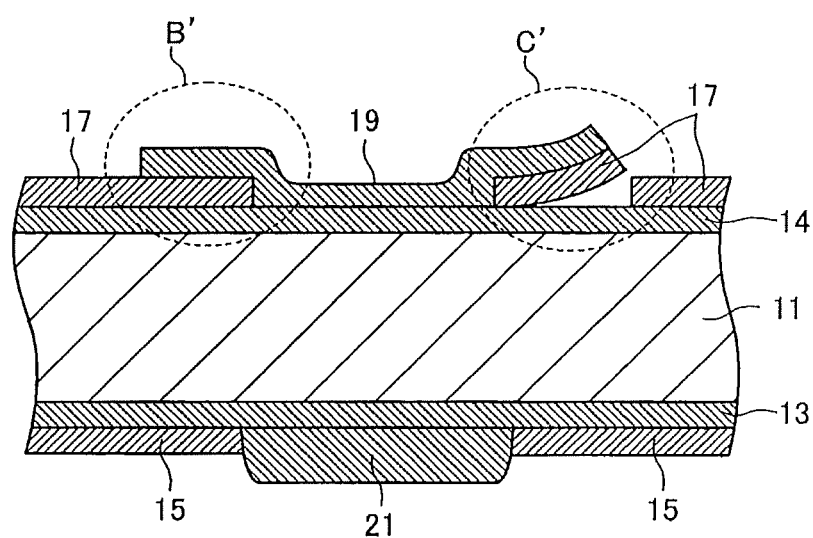
Figure 3:
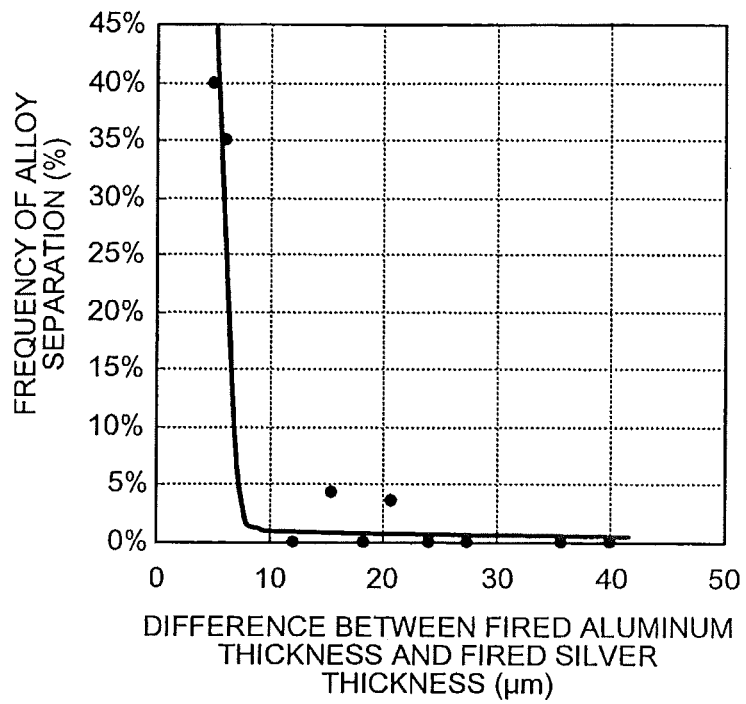
Figure 4:
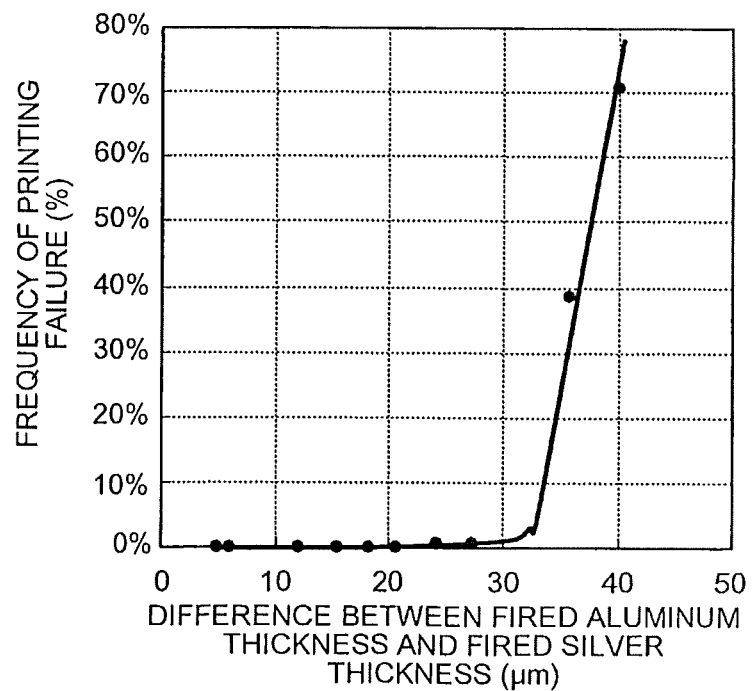

FIGS. 3 and 4 are graphs of characteristics obtained from the experiment in which the thickness of the aluminum electrode 17 and the back-surface silver electrode 19 was varied in the solar cell configured such that the periphery of the back-surface silver electrode 19 overlaps the aluminum electrode 17 in the in-plane direction of the semiconductor layer 10. FIG. 3 is a plot of correlation between the difference in the thickness of the aluminum electrode 17 and the back-surface silver electrode 19 after the firing in the electrode forming process (a value obtained by subtracting the thickness $t_{Ag}$ of the back-surface silver electrode 19 from the thickness $t_{Al}$ of the aluminum electrode 17), and an occurrence frequency of the alloy separation. The occurrence frequency of the alloy separation indicates how many cells causes the alloy separation among the tested cells.

On the other hand, FIG. 4 is a plot of correlation between the difference in the thickness of the aluminum electrode 17 and the back-surface silver electrode 19 after the firing in the electrode forming process (a value obtained by subtracting the thickness $t_{Ag}$ of the back-surface silver electrode 19 from the thickness $t_{Al}$ of the aluminum electrode 17), and frequency of printing failure. The printing failure includes insufficient paste-coating, such as blurred printing, occurred in an alloyed area and around the alloyed area, and faulty electrode fabrication. The frequency of the printing failure indicates how many cells causes the printing failure among the tested cells.

It can be seen in FIG. 3 that, when the difference in the thickness of the aluminum electrode 17 and the back-surface silver electrode 19 after the firing in the electrode forming process (a value obtained by subtracting the thickness $t_{Ag}$ of the back-surface silver electrode 19 from the thickness $t_{Al}$ of the aluminum electrode 17) is equal to or more than 10 micrometers, the frequency of the alloy separation sharply decreases. On the other hand, it can be seen in FIG. 4 that, when the difference in the thickness of the aluminum electrode 17 and the back-surface silver electrode 19 after the firing in the electrode forming process (a value obtained by subtracting the thickness $t_{Ag}$ of the back-surface silver electrode 19 from the thickness $t_{Al}$ of the aluminum electrode 17) is equal to or more than 30 micrometers, the frequency of the printing failure sharply increases.

According to another experiment and test, it has been found that alloy separation occurs at the interface between the silicon substrate and the electrodes (where aluminum and silver are partially) beneath the end of the overlapped area of the aluminum electrode 17 and the back-surface silver electrode 19. It has also been found that, when silver concentration at the interface is higher, the electrode separation (alloy separation) is likely to occur.

In an area where the aluminum or the silver directly contacts the silicon, the electrode separation (alloy separation) is not detected and they are bonded well. Therefore, it can be presumed that, when an alloy of aluminum and silicon contains silver at a certain level, the bonding capability is reduced due to a change of a thermal expansion factor or other actions.

According to the above result, to prevent the electrode separation (alloy separation) from occurring, it is necessary to reduce the silver concentration around the interface between the silicon substrate ($p^+$ layer 14) and the electrodes (alloy). In addition, it is effective to increase the thickness $t_{Al}$ of the aluminum electrode 17 or to reduce the thickness $t_{Ag}$ of the back-surface silver electrode 19. On the other hand, the printing failure is due to an inadequate coverage of the paste caused by the difference between the thickness $t_{Al}$ of the aluminum electrode 17 and the thickness $t_{Ag}$ of the back-surface silver electrode 19.

Thus, by setting the thickness $t_{Al}$ of the aluminum electrode 17 larger than the thickness $t_{Ag}$ of the back-surface silver electrode 19 as well as setting the difference between the thickness $t_{Al}$ of the aluminum electrode 17 and the thickness $t_{Ag}$ of the back-surface silver electrode 19 not less than 10 micrometers and not more than 30 micrometers, the inventors has achieved a solar cell with the configuration that the periphery of the back-surface silver electrode 19 overlaps the aluminum electrode 17 in the in-plane direction of the semiconductor layer 10, in which the silicon substrate ($p^+$ layer 14) and the aluminum electrode 17 (partially alloyed with the back-surface silver electrode 19) are firmly bonded together, and the electrode separation (alloy separation) is prevented from occurring.

In the solar cell having the above configuration according to the embodiment, as shown in FIG. 1-4, in the area B and the area C where the aluminum electrode 17 and the back-surface silver electrode 19 are partially overlapped each other, bonding strength is increased at the interface between the silicon substrate ($p^+$ layer 14) and the aluminum electrode 17 (the aluminum electrode 17 partially alloyed with the back-surface silver electrode 19), thereby better bonding is realized. As a result, it becomes possible to effectively prevent the electrode separation (alloy separation). Furthermore, it becomes possible to prevent the printing failure (faulty electrode fabrication) caused by the difference in the thickness of the aluminum electrode 17 and the black-surface silver electrode 19 after the firing in the electrode forming process (a value obtained by subtracting the thickness of the back-surface silver electrode 19 from the thickness of the aluminum electrode 17).

As described above, in the solar cell according to the embodiment, while the faulty electrode fabrication is prevented, the silicon substrate ($p^+$ layer 14) and the aluminum electrode 17 (the aluminum electrode 17 partially alloyed with the back-surface silver electrode 19) are firmly bonded together, and thereby it is possible to effectively prevent the electrode separation (alloy separation).

Next, a method of manufacturing the solar cell configured as above according to the embodiment is explained. Generally, in an inexpensive solar cell a silicon substrate is used to generate photovoltaic power with a simple p-n junction and an n-layer of a few hundred nanometers in thickness is formed by diffusing group V elements such as phosphorous (P) on a p-type silicon substrate of a few hundreds micrometers in thickness. According to the present invention, both single crystal and polycrystalline silicon can be used for the p-type silicon substrate; however, an explanation below is made with an example of a single crystal substrate with a plane orientation (100).

A process of producing the solar cell is briefly explained. In the process of producing the solar cell, the n-layer and a convex and concave texture for keeping light on a substrate side therein are provided on the surface of the p-type silicon substrate with a specific resistance of 0.1 to 5 ohm centimeters, and an antireflective coating is provided thereon. Then, a silver electrode is provided on a front surface of the substrate.

Next, an aluminum electrode is provided on a back surface of the substrate, and a $p^+$ layer is provided to create a back-surface field (BSF) effect so that electron concentration of the $p^+$ layer is increased by an electric field of a band structure and electrons in the $p^+$ layer do not disappear. With the aluminum electrode, it is also expected to create a back-surface reflection (BSR) effect of reflecting the long-wave light that passes through the silicon substrate and reusing the long-wave light to generate power. However, the aluminum electrode causes considerable warpage of the substrate and induces substrate crack. Therefore, the aluminum electrode may be removed after the $p^+$ layer is formed by thermal treatment. Lastly, a silver electrode is provided on the back surface of the substrate, and the solar cell is thereby completed.

Figures 1, 5:
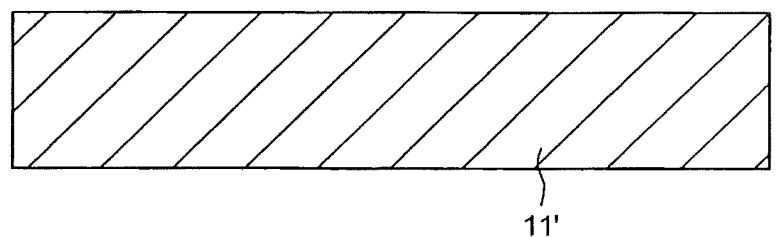
Figures 2, 5:
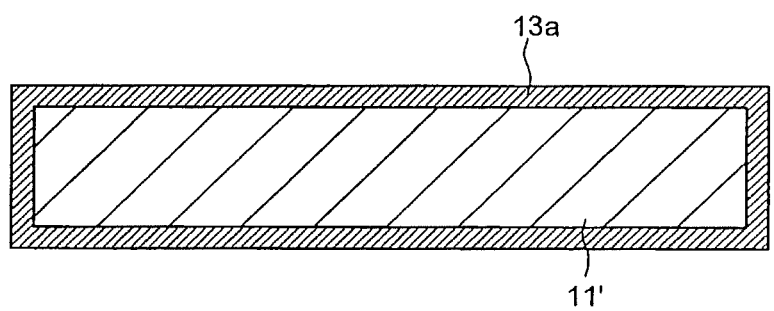
Figures 3, 5:
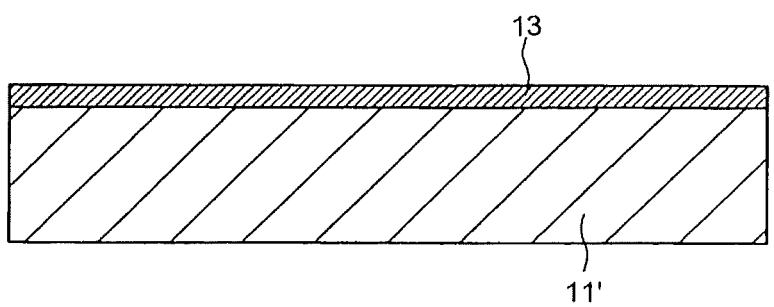
Figures 4, 5:
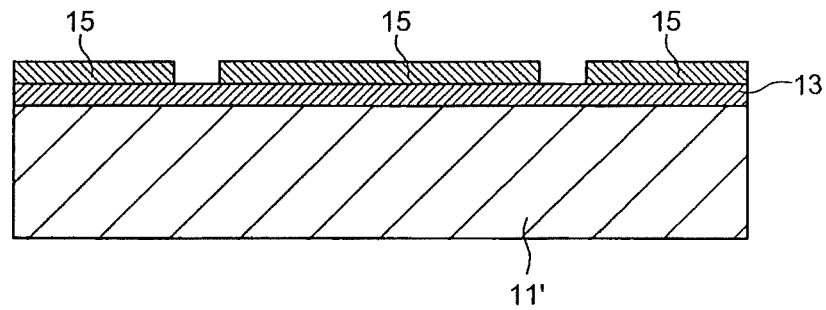
Figure 5:
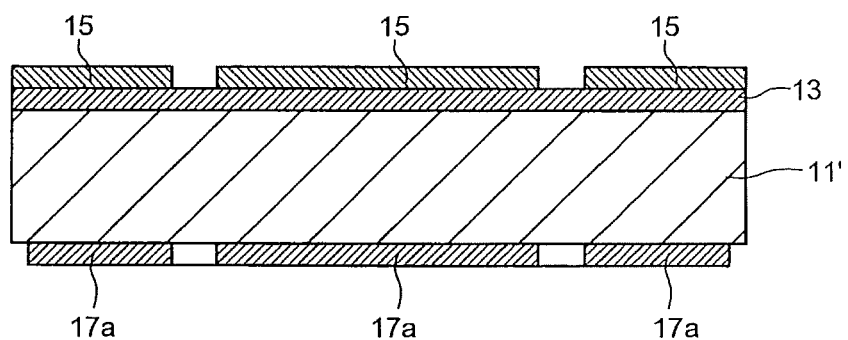

In the following, the method of manufacturing the solar cell according to the embodiment is explained in detail with reference to the drawings. To produce the solar cell according to the embodiment, as shown in FIG. 5-1, a p-type silicon substrate 11' is sliced out of, for example, a p-type single-crystal silicon ingot produced by the pulling method or a polycrystalline silicon ingot produced by the casting method. The silicon substrate 11' is etched by a thickness of about 10 to 20 micrometers using, for example, a few to 20 wt/% of sodium hydroxide or sodium carbonate, and a damaged layer and dirt on the silicon surface caused by the slicing are removed.

Further, if necessary, the silicon substrate 11' is washed with a mixed solution of hydrochloric acid and hydrogen peroxide to remove heavy metals such as iron adhered onto the substrate surface. An anisotropic etching is then performed with a solution made by adding isopropyl alcohol (IPA) to a similar low-concentrated alkaline solution to form a texture so that, for example, the surface of the silicon (11') is exposed.

Next, an n-type diffusion layer 13a is formed to form a p-n junction. In the process of forming the n-type diffusion layer 13a, for example, phosphorus oxychloride ($POCl_3$) is used; a diffusion process is performed in a mixture gas atmosphere of nitrogen and oxygen at 800 to 900 degrees Celsius, and phosphorus is thermally diffused as shown in FIG. 5-2 to form the n-type diffusion layer 13a with the inverse conductivity type all over the surface of the silicon substrate 11'. The sheet resistance of the n-type diffusion layer 13a is, for example, several tens of (30 to 80) ohm/square, and the depth of the n-type diffusion layer 13a is, for example, about 0.3 to 0.5 micrometer.

To protect the n-type diffusion layer 13a on the light receiving surface, polymer resistive paste is printed by screen printing and dried to form resist. The n-type diffusion layer 13a formed on the back and side of the silicon substrate 11' is removed by soaking the silicon substrate 11' in a solution of, for example, 20 wt/% potassium hydroxide for a few minutes. The resist is then removed by an organic solvent to obtain the silicon substrate 11' with the n-type diffusion layer 13 formed all over the surface (light receiving surface) thereof as shown in FIG. 5-3.

As shown in FIG. 5-4, the antireflective coating 15 made of a silicon oxide film, a silicon nitride film, or titanium oxide film is formed on the n-type diffusion layer 13 in a uniform thickness. In the case of the silicon oxide film, for example, the antireflective coating 15 is formed by plasma chemical vapor deposition (CVD) using silane ($SiH_4$) gas and ammonia ($NH_3$) gas as raw materials at a heating temperature equal to or higher than 300 degrees Celsius under reduced pressure. For example, the refractive index is about 2.0 to 2.2, and the optimal thickness of the antireflective coating 15 is about 70 to 90 nanometers. It should be noted that the antireflective coating formed as above is an insulator; simply forming a front-surface electrode on the antireflective coating does not produce a solar cell.

Next, an aluminum paste including a glass is printed all over the back surface of the silicon substrate 11' (an opposite surface of the light-receiving surface) by screen printing and dried to form an aluminum paste layer 17a all over the back surface of the silicon substrate 11' as shown in FIG. 5-5. On the aluminum paste layer 17a are formed openings each corresponding to a part where the back-surface silver electrode 19 is formed. The thickness of the aluminum paste layer 17a can be adjusted, for example, by the wire diameter of a screen mask or emulsion thickness.

Figures 5, 6:
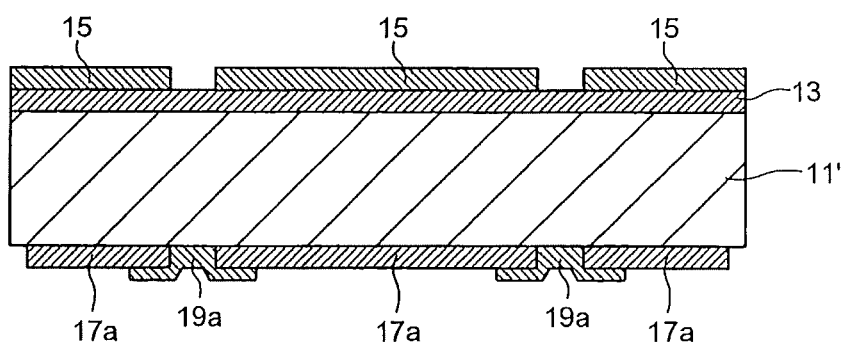

Next, a silver paste for the back-surface silver electrode 19 is printed by screen printing all over the back surface of the silicon substrate 11' (an opposite surface of the light-receiving surface), on which is formed the aluminum electrode 17, and dried to form a silver paste layer 19a as shown in FIG. 5-6. In the process of forming the aluminum paste layer 17a and the silver paste layer 19a, the thickness of each layer is adjusted so that the thickness $t_{Al}$ of the aluminum electrode 17 is to be larger than the thickness $t_{Ag}$ of the back-surface silver electrode 19 and a difference between the thickness $t_{Al}$ of the aluminum electrode 17 and the thickness $t_{Ag}$ of the back-surface silver electrode 19 is to be within a range from equal to or more than 10 micrometers to equal to or less than 30 micrometers after the firing.

The silver paste can be printed by using a screen mask with a pattern of emulsion 27 formed on a mesh 25 as shown in FIGS. 5-7 and 5-8. A mask frame 29 is formed at the periphery of the surface of the mesh 25 opposite to the surface on which the emulsion 27 is present. Similarly, the aluminum paste can also be printed by using the screen mask with a pattern of the emulsion 27 formed on the mesh 25. The thickness of the aluminum paste can be adjusted, for example, by the wire diameter of the mesh 25 that forms the screen mask or emulsion thickness. Similarly, the thickness of the silver paste can also be adjusted, for example, by the wire diameter of the mesh 25 that forms the screen mask or the emulsion thickness.

Conventionally, there has been a priority on optimizing the amount of the aluminum paste to be coated that affects the amount of the warpage of the substrate or characteristics of the solar cell (aforementioned BSF effect or BSR effect). Therefore, the amount of the silver paste to be coated has not been optimized, and the thicknesses of the back-surface aluminum electrode and the back-surface silver electrode after the firing have been almost the same.

Next, a silver paste for the front-surface silver electrode 21 is printed by screen printing all over the front surface of the silicon substrate 11' (light-receiving surface), on which is formed the antireflective coating 15, and dried to from a silver paste layer 21a as shown in FIG. 5-9. The thickness of the silver paste can be adjusted by the wire diameter of the mesh 25 that forms the screen mask, emulsion thickness, or the like.

Next, in a firing process of forming the electrodes, the paste layers for both the front-surface and back-surface electrodes are fired simultaneously at about 600 to 900 degrees Celsius for a few to more than 10 minutes. On the front-surface (light-receiving surface) of the silicon substrate 11', the silver paste layer is fired to form the front-surface silver electrode 21 as shown in FIG. 5-10; while the antireflective coating 15 is melting, silver material contacts silicon in the silicon substrate 11' through glass material included in the silver paste, and the antireflective coating 15 is solidified again. Thereby, conductivity between the front-surface silver electrode 21 and the silicon can be obtained. The above process is generally called a fire-through process.

On the other hand, on the back surface (opposite surface of the light-receiving surface) of the silicon substrate 11', the aluminum paste layer is fired to form the aluminum electrode 17 and the silver paste layer is fired to form the back-surface silver electrode 19 as shown in FIG. 5-10. Then, the aluminum in the aluminum paste reacts to the silicon in the silicon substrate 11', which forms the $p^+$ layer 14 beneath the aluminum electrode 17. The layer is generally called a back-surface field (BSF) layer, and contributes to improve the energy conversion efficiency of the solar cell. In the silicon substrate 11', an area between the n-type diffusion layer 13 and the $p^+$ layer 14 is made to the p-type layer 11.

The silver paste reacts directly to the silicon in the silicon substrate 11' in an area where the silver paste directly contacts the silicon substrate 11', while, in an area where the silicon paste contacts the aluminum paste, three metals of silicon in the silicon substrate 11', aluminum in the aluminum paste (aluminum electrode 17), and silver in the back-surface silver electrode 19 are partially alloyed. The solar cell is completed by the solar cell manufacturing process involving the above steps. In a module manufacturing process performed after the cell fabrication, a lead tab of copper is provided on the back-surface silver electrode 19 to take out electric power.

According to the method of manufacturing the solar cell configured as above of the embodiment, in the area B and the area C where the aluminum electrode 17 and the back-surface silver electrode 19 are partially overlapped each other, bonding strength is increased at the interface between the silicon substrate (p⁺ layer 14) and the aluminum electrode 17 (the aluminum electrode 17 partially alloyed with the back-surface silver electrode 19), thereby better bonding is realized. As a result, it becomes possible to effectively prevent the electrode separation (alloy separation). Furthermore, it becomes possible to prevent the printing failure (faulty electrode fabrication) caused by the difference in the thickness of the aluminum electrode 17 and the back-surface silver electrode 19 after the firing (a value obtained by subtracting the thickness of the back-surface silver electrode 19 from the thickness of the aluminum electrode 17).

Therefore, according to the method of manufacturing the solar cell configured as above of the embodiment, it is possible to realize a solar cell in which, while faulty electrode fabrication is prevented, the silicon substrate (p⁺ layer 14) and the aluminum electrode 17 (the aluminum electrode 17 partially alloyed with the back-surface silver electrode 19) are firmly bonded together to effectively prevent electrode separation (alloy separation).

Second Embodiment

In the chapter of a second embodiment, the solar cell according to another embodiment of the present invention is explained. In the first embodiment described above, the thickness of the aluminum electrode 17 is uniform; however, the thickness of the aluminum electrode 17 is not necessarily uniform according to the present invention.

In the present invention, when, for example, the thickness of the back-surface silver electrode 19 is fixed, it is necessary to increase the thickness of the aluminum electrode 17. In this case, consumption of the aluminum paste increases, resulting in high manufacturing costs. In addition, the thicker aluminum electrode 17 increases the warpage of the substrate caused by the stress generated by heating or cooling.

Figures 5, 6, 7:
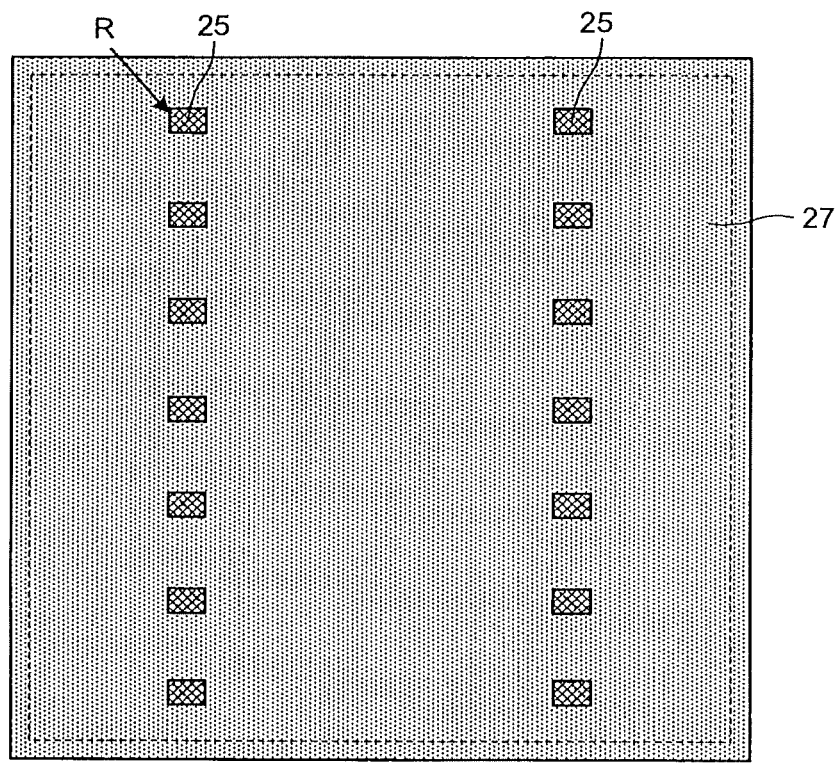
Figures 5, 6, 7, 8:
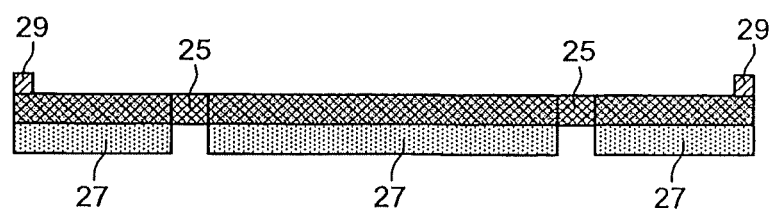
Figures 5, 6, 7, 8, 9:
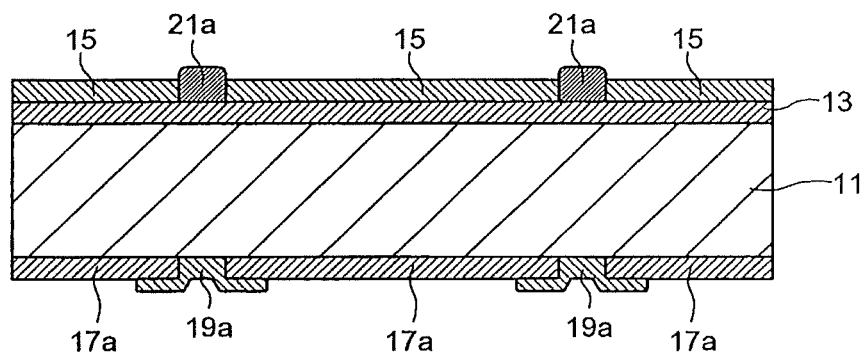
Figures 5, 6, 7, 8, 9, 10:
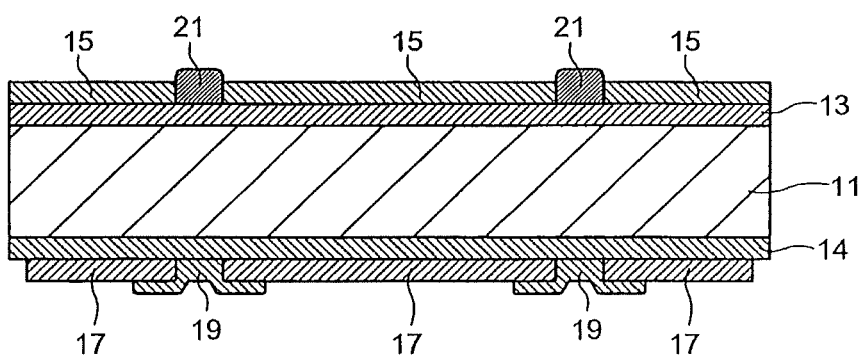
Figure 6:
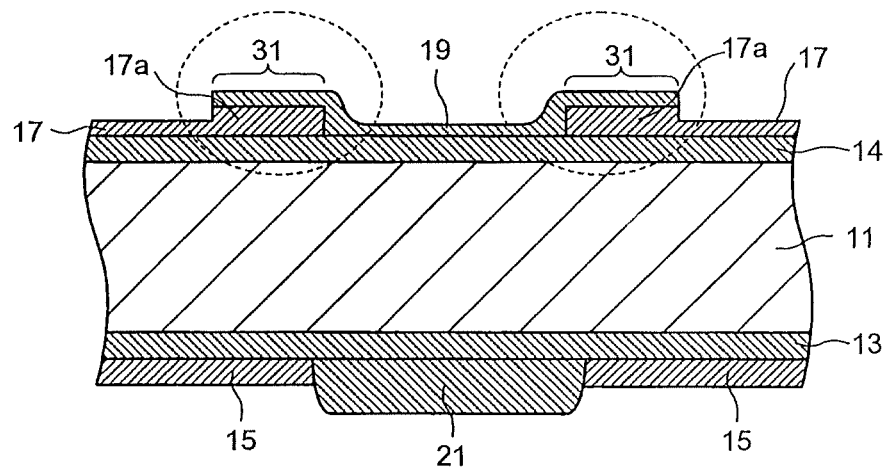
Figure 7:
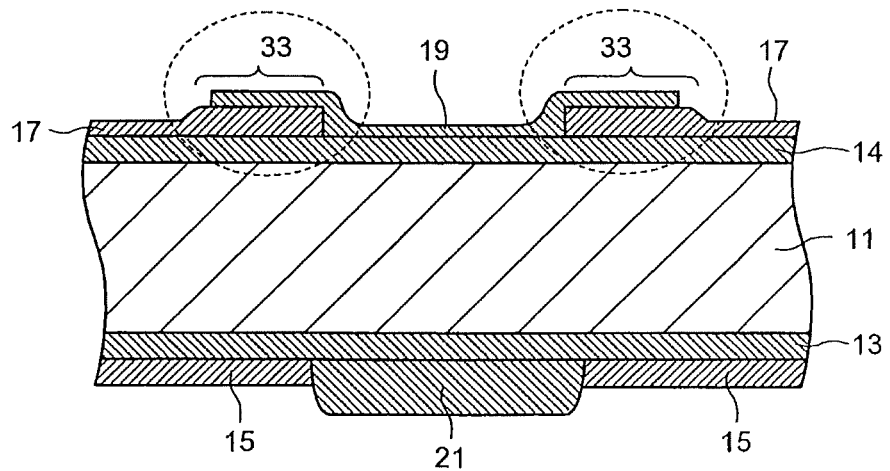

To prevent the above problems, it is effective to increase the thickness of the aluminum electrode only in an overlapped area 31 of the aluminum electrode 17 and the back-surface silver electrode 19 as shown in FIG. 6, or to increase the thickness of the aluminum electrode only in an overlapped area of the aluminum electrode 17 and the back-surface silver electrode 19 with its neighboring area 33 as shown in FIG. 7. A basic structure of the solar cell according to the embodiment shown in FIGS. 6 and 7 is similar to that of the solar cell according to the first embodiment described above except the overlapping of the aluminum electrode 17 and the back-surface silver electrode 19, and therefore, reference may be had to the description of the first embodiment.

Fabrication of the above aluminum electrode 17 can be realized by increasing the thickness of the emulsion of the screen mask for forming an electrode, which is described in the first embodiment, in a neighboring area of the overlapped area 31 of the aluminum electrode 17 and the back-surface silver electrode 19, or in a neighboring area of the overlapped area of the aluminum electrode 17 and the back-surface silver electrode 19 with its neighboring area 33.

INDUSTRIAL APPLICABILITY

As described above, the solar cell according to the present invention is useful as a solar cell configured with an aluminum electrode and a silver electrode for extracting electric power partially overlapped with each other.

The invention claimed is:

1. A solar cell comprising:
a photoelectric conversion substrate that includes a first surface and a second surface;
a first electrode arranged on the first surface;
a second electrode arranged on the second surface and made from a first metal paste; and
a third electrode that is made from a second metal paste, different from the first metal paste, and extracts electric power from the second electrode, and arranged on the second surface with a periphery portion overlapping the second electrode in an in-plane direction of the photoelectric conversion substrate, wherein
a thickness of the second electrode is larger than a thickness of the overlapped portion of the third electrode, and a difference between the thickness of the second electrode and the thickness of the overlapped portion of the third electrode is not less than 10 micrometers and not more than 30 micrometers, wherein
the third electrode forms an integrated region where the first metal paste and the second metal paste are at least partially melted and solidified, the overlapped portion including the integrated region, wherein
the thickness of the second electrode is larger than the thickness of the third electrode only in an area where the second electrode overlaps the third electrode.

2. The solar cell according to claim 1, wherein the second electrode is an aluminum electrode, and the third electrode is a silver electrode.

3. The solar cell according to claim 1, wherein the difference between the thickness of the second electrode and the thickness of the overlapped portion of the third electrode is not less than 12 µm and not more than 27 µm.

* * * * *